(12) United States Patent
Goto et al.

(10) Patent No.: US 11,456,720 B2
(45) Date of Patent: Sep. 27, 2022

(54) BONDED BODY WITH PIEZOELECTRIC MONOCRYSTALLINE SUBSTRATE AND SUPPORTING SUBSTRATE

(71) Applicant: NGK Insulators, Ltd., Nagoya (JP)

(72) Inventors: Masashi Goto, Nagoya (JP); Tomoyoshi Tai, Inazawa (JP); Takahiro Yamadera, Nagoya (JP); Yuji Hori, Owariasahi (JP); Keiichiro Asai, Nagoya (JP); Masahiko Namerikawa, Seto (JP); Takashi Yoshino, Ama (JP)

(73) Assignee: NGK INSULATORS, LTD., Nagoya (JP)

(*) Notice: Subject to any disclaimer, the term of this patent is extended or adjusted under 35 U.S.C. 154(b) by 796 days.

(21) Appl. No.: 16/422,322

(22) Filed: May 24, 2019

(65) Prior Publication Data

US 2019/0288660 A1 Sep. 19, 2019

Related U.S. Application Data

(63) Continuation of application No. PCT/JP2017/036133, filed on Oct. 4, 2017.

(30) Foreign Application Priority Data

Nov. 25, 2016 (JP) .............................. JP2016-228903

(51) Int. Cl.
*H03H 9/02* (2006.01)
*H01L 41/18* (2006.01)
(Continued)

(52) U.S. Cl.
CPC ......... *H03H 9/02574* (2013.01); *C30B 29/30* (2013.01); *H01L 41/18* (2013.01);
(Continued)

(58) Field of Classification Search
CPC .......... H03H 9/02574; H03H 9/02559; H03H 9/02622; H03H 3/08; H03H 9/02585; H03H 9/059
See application file for complete search history.

(56) References Cited

U.S. PATENT DOCUMENTS 7,213,314 B2 5/2007 Abbott et al.
7,331,092 B2 2/2008 Miura et al.
(Continued)

FOREIGN PATENT DOCUMENTS

JP 3774782 B2 5/2003
JP 2004-343359 A 12/2004
(Continued)

OTHER PUBLICATIONS

Japanese language International Search Report dated Dec. 26, 2017 issued in PCT/JP2017/036133.
(Continued)

*Primary Examiner* — Derek J Rosenau
(74) *Attorney, Agent, or Firm* — Flynn Thiel, P.C.

(57) ABSTRACT

A piezoelectric monocrystalline substrate is composed of a material represented by $LiAO_3$ (A represents at least one element selected from the group consisting of niobium and tantalum), a bonding layer is compose of a material of an oxide of at least one element selected from the group consisting of niobium and tantalum, and an interface layer is provided along an interface between the piezoelectric monocrystalline substrate 6 and bonding layer, and the interface layer has a composition of $E_xO_{(1-x)}$ (E represents at least one element selected from the group consisting of niobium and tantalum and $0.29 \leq x \leq 0.89$).

7 Claims, 5 Drawing Sheets

(51) Int. Cl.

| | | |
|---|---|---|
| *C30B 29/30* | (2006.01) | |
| *H01L 41/312* | (2013.01) | |
| *H03H 3/08* | (2006.01) | |
| *H03H 9/05* | (2006.01) | |
| *H03H 9/25* | (2006.01) | |

(52) U.S. Cl.
CPC ............. *H01L 41/312* (2013.01); *H03H 3/08* (2013.01); *H03H 9/02559* (2013.01); *H03H 9/02622* (2013.01); *H03H 9/059* (2013.01); *H03H 9/0585* (2013.01); *H03H 9/25* (2013.01)

(56) References Cited

U.S. PATENT DOCUMENTS

| | | | |
|---|---|---|---|
| 8,264,303 | B2 | 9/2012 | Suzuki |
| 8,729,771 | B2 | 5/2014 | Kobayashi et al. |
| 8,736,141 | B2 | 5/2014 | Iwamoto |
| 8,907,547 | B2 | 12/2014 | Tai et al. |
| 2016/0047984 | A1 | 2/2016 | Kondo et al. |
| 2016/0049469 | A1 | 2/2016 | Koshikawa et al. |
| 2019/0036509 | A1 | 1/2019 | Tai et al. |
| 2019/0123709 | A1* | 4/2019 | Inoue .................. H03H 9/0222 |
| 2020/0186119 | A1* | 6/2020 | Yamamoto ......... H03H 9/02866 |

FOREIGN PATENT DOCUMENTS

| | | | |
|---|---|---|---|
| JP | 2010-187373 | A | 8/2010 |
| JP | 5814727 | B2 | 4/2012 |
| JP | 3187231 | U | 11/2013 |
| JP | 2014-86400 | A | 5/2014 |
| WO | 2012/124648 | A1 | 9/2012 |
| WO | 2014/077213 | A1 | 5/2014 |
| WO | 2014/142347 | A1 | 9/2014 |
| WO | 2014/192597 | A1 | 12/2014 |
| WO | 2017/163723 | A1 | 9/2017 |

OTHER PUBLICATIONS

Japanese language Written Opinion dated Dec. 26, 2017 issued in PCT/JP2017/036133.

Takaki, Hideki; "Room-temperature wafer bonding by the surface activation method"; Proceedings of the 22nd Meeting of the Japan Institute of Electronics Packaging; retrieved on Dec. 14, 2017.

English translation of Notification of Transmittal of Translation of International Preliminary Report on Patentability issued in International Application No. PCT/JP2017/036133, dated Jun. 6, 2019 (1 page).

English translation of International Preliminary Report on Patentability issued in International Application No. PCT/JP2017/036133, dated Jun. 6, 2019 (1 page).

English translation of Written Opinion of the International Searching Authority issued in International Application No. PCT/JP2017/036133, dated Jun. 6, 2019 (7 pages).

* cited by examiner

BONDED BODY WITH PIEZOELECTRIC MONOCRYSTALLINE SUBSTRATE AND SUPPORTING SUBSTRATE

CROSS-REFERENCE TO RELATED APPLICATIONS

This application is a continuation application of PCT/JP2017/036133, filed Oct. 4, 2017, which claims priority to Japanese Application No. 2016-228903, filed Nov. 25, 2016, the entire contents all of which are incorporated hereby by reference.

TECHNICAL FIELD

The present invention relates to a bonded body of a specific piezoelectric monocrystalline substrate and supporting substrate.

BACKGROUND ARTS

It is known a surface acoustic wave device functioning as a filter device or oscillator used in mobile phones or the like, and an acoustic wave device such as lamb wave device or film bulk acoustic resonator (FBAR) using a piezoelectric thin film. As such acoustic wave device, it is known a device produced by adhering a supporting substrate and a piezoelectric substrate propagating a surface acoustic wave and by providing interdigitated electrodes capable of oscillating the surface acoustic wave on a surface of the piezoelectric substrate. By adhering the supporting substrate whose thermal expansion coefficient is lower than that of the piezoelectric substrate onto the piezoelectric substrate, the change of a size of the piezoelectric substrate responsive to temperature change is reduced so that the change of the frequency characteristics as the surface acoustic wave device is reduced.

For example, it is proposed, in patent document 1, that a surface acoustic wave device having the structure produced by adhering a piezoelectric substrate and silicon substrate with an adhesive layer composed of an epoxy adhering agent.

Here, it is known that, in bonding a piezoelectric substrate and silicon substrate, a silicon oxide film is formed on a surface of the piezoelectric substrate and that a silicon substrate and the piezoelectric substrate are bonded through the silicon oxide film (patent document 2). In the case of the bonding, plasma beam is irradiated onto the surfaces of the silicon oxide film and silicon substrate to activate the surfaces, followed by the direct boding (Plasma activation method).

Further, it is known that a surface of the piezoelectric substrate is made a roughened surface, a filler layer is provided on the roughened surface to provide a flattened surface and the filler layer is adhered onto a silicon substrate through an adhering layer (patent document 3). According to this method, an epoxy-based or acryl-based resin is used for the filler layer and adhering layer, and the bonding surface of the piezoelectric substrate is made the roughened surface to reduce the reflection of bulk wave and to reduce spurious wave.

Further, it is known direct bonding method of so-called FAB (Fast Atom Beam) system (patent document 4). According to this method, neutralized atomic beam is irradiated onto the respective bonding surfaces at ambient temperature to activate them, followed by the direct bonding.

On the other hand, according to patent document 5, it is described that a piezoelectric monocrystalline substrate is directly bonded to a supporting substrate made of a ceramic material (alumina, aluminum nitride, silicon nitride) and not to a silicon substrate, through an intermediate layer. The material of the intermediate layer is silicon, silicon oxide, silicon nitride or aluminum nitride.

PRIOR TECHNICAL DOCUMENTS

Patent Documents (Patent document 1) Japanese patent publication No. 2010-187373A
(Patent document 2) U.S. Pat. No. 7,213,314 B2
(Patent document 3) Japanese Patent No. 5,814,727B
(Patent document 4) Japanese Patent Publication No. 2014-086400A
(Patent document 5) U.S. Pat. No. 3,774,782B

SUMMARY OF THE INVENTION

Objects to be Solved by the Invention

However, it is particularly difficult to bond a piezoelectric monocrystalline substrate made of lithium niobate or tantalum niobate stably and strongly onto a supporting substrate.

An object of the present invention is to provide microstructure in which a piezoelectric monocrystalline substrate made of lithium niobate or lithium tantalate and a supporting substrate strongly.

Solution for the Objects

The present invention provides a bonded body comprising a supporting substrate, a piezoelectric monocrystalline substrate and a bonding layer provided between said supporting substrate and said piezoelectric monocrystalline substrate,
wherein said piezoelectric monocrystalline substrate comprises a material represented by $LiAO_3$ (A represents at least one element selected from the group consisting of niobium and tantalum),
wherein said bonding layer comprises a material comprising an oxide of at least one element selected from the group consisting of niobium and tantalum, and
wherein said bonded body further comprises an interface layer along an interface between said piezoelectric monocrystalline substrate and said bonding layer, said interface layer comprising a composition of $E_xO_{(1-x)}$ (E represents at least one element selected from the group consisting of niobium and tantalum and $0.29 \leq x \leq 0.89$)

Effect of the Invention

According to the present invention, it is successfully provided microstructure in which a piezoelectric monocrystalline substrate made of lithium niobite, lithium tantalate or the like and a supporting substrate strongly.

EMBODIMENTS FOR CARRYING OUT THE INVENTION

The present invention will be described in detail below, appropriately referring to attached drawings.

Figure 1A:
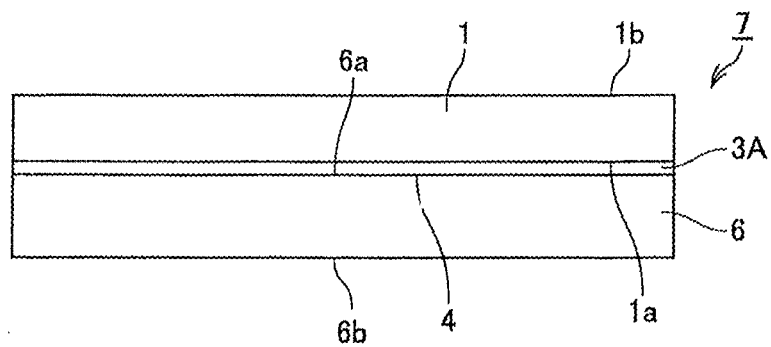
FIG. 1(a) is a diagram schematically showing a bonded body 7 according to an embodiment of the present invention.

The bonded body of the present invention includes a supporting substrate, a piezoelectric monocrystalline substrate and a bonding layer provided between the supporting substrate and piezoelectric monocrystalline substrate. For example, according to a bonded body 7 shown in FIG. 1(a), an activated surface 6a of a piezoelectric monocrystalline substrate 6 is bonded onto a surface 1a of a supporting substrate 1 through a bonding layer 3A. 1b represents a surface on the opposite side of the surface 1a of the supporting substrate.

The material of the piezoelectric monocrystalline substrate is made $LiAO_3$. Here, A represents at least one element selected from the group consisting of niobium and tantalum. Thus, $LiAO_3$ may be lithium niobate, lithium tantalate or lithium niobate-lithium tantalate solid solution.

Further, the material of the bonding layer is made an oxide of at least one element selected from the group consisting of niobium and tantalum. The oxide maybe an oxide of tantalum, an oxide of niobium or a composite oxide of niobium and tantalum.

According to the present invention, it is provided an interface layer having a composition of $E_xO_{(1-x)}$ (E represents at least one element selected from the group consisting of niobium and tantalum, and $0.29 \leq x \leq 0.89$), along an interface between the piezoelectric monocrystalline substrate and bonding layer. Here, the element E of $E_xO_{(1-x)}$ maybe niobium alone, tantalum alone, or both of niobium and tantalum.

Figure 1B:
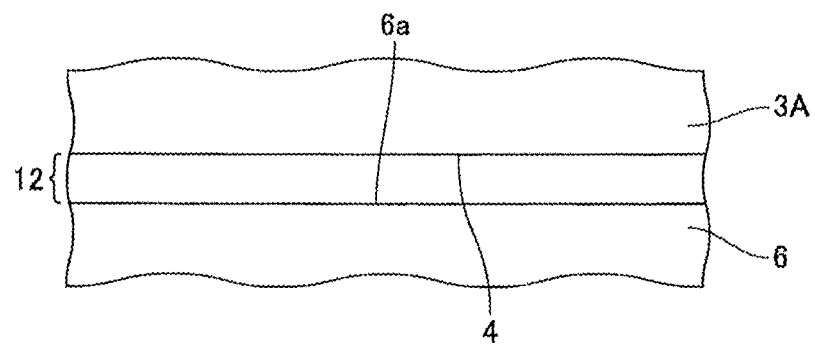
FIG. 1(b) is an enlarged view showing essential parts of the bonded body 7.

That is, according to an example shown in FIG. 1(b), it is provided an interface layer 12 having a composition of $E_xO_{(1-x)}$ (E represents at least one element selected from the group consisting of niobium and tantalum, and $0.29 \leq x \leq 0.89$) between the activated surface 6a of the piezoelectric monocrystalline substrate 6 and activated surface 4 of the bonding layer 3A.

Further, according to a preferred embodiment, it is provided a substrate-side intermediate layer having a composition of $G_yO_{(1-y)}$ (G represents at least one element selected from the group consisting of niobium and tantalum, and $x<y \leq 0.91$), between the interface layer and piezoelectric monocrystalline substrate. Further, according to a preferred embodiment, it is provided a bonding layer-side intermediate layer having a composition of $J_zO_{(1-z)}$ (J represents at least one element selected from the group consisting of niobium and tantalum, and $x<z \leq 0.95$), between the intermediate layer and bonding layer.

Figure 1C:
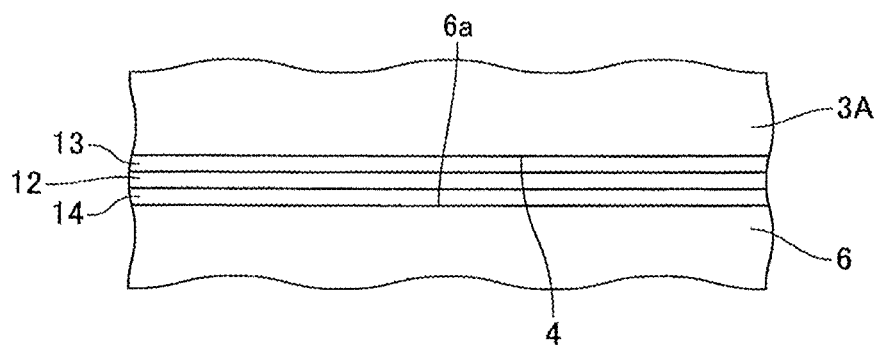
FIG. 1(c) is a view showing essential parts of another bonded body.

That is, according to an example shown in FIG. 1(c), it is provided the substrate-side intermediate layer 14 having a composition of the composition of $G_yO_{(1-y)}$, between the interface layer 12 and piezoelectric monocrystalline substrate 6, and it is provided the bonding layer-side intermediate layer 13 having a composition of $J_zO_{(1-z)}$, between the interface layer 12 and bonding layer 3A.

Here, the composition of the interface layer provided between the piezoelectric monocrystalline substrate and bonding layer is $E_xO_{(1-x)}$. It means that it is generated the interface layer whose Ta content or Nb content is higher than the Ta contents or Nb contents of the piezoelectric monocrystalline substrate and bonding layer. In the case that such interface layer is provided, it is found that the strength at the interface of the piezoelectric monocrystalline substrate and bonding layer is considerably improved and a high crack opening strength can be obtained.

On the viewpoint of the present invention, x is made 0.29 or higher and preferably 0.34 or higher. Further, on the viewpoint of the present invention, x is made 0.89 or lower and preferably 0.64 or lower.

Further, in the substrate-side intermediate layer having a composition of $G_yO_{(1-y)}$ and bonding layer-side intermediate layer having a composition of $J_zO_{(1-z)}$, on the viewpoint of the present invention, y and z are made higher than x, and the differences may be preferably be made 0.01 or larger and more preferably be made 0.02 or larger. Further, according to the viewpoint of the present invention, y is preferably 0.30 or higher, and the upper limit of y is 0.91 and y may preferably be 0.89 or lower. Further, z may preferably be made 0.35 or higher, and the upper limit of z is 0.95, z may preferably be made 0.89 or lower.

Figure 2:
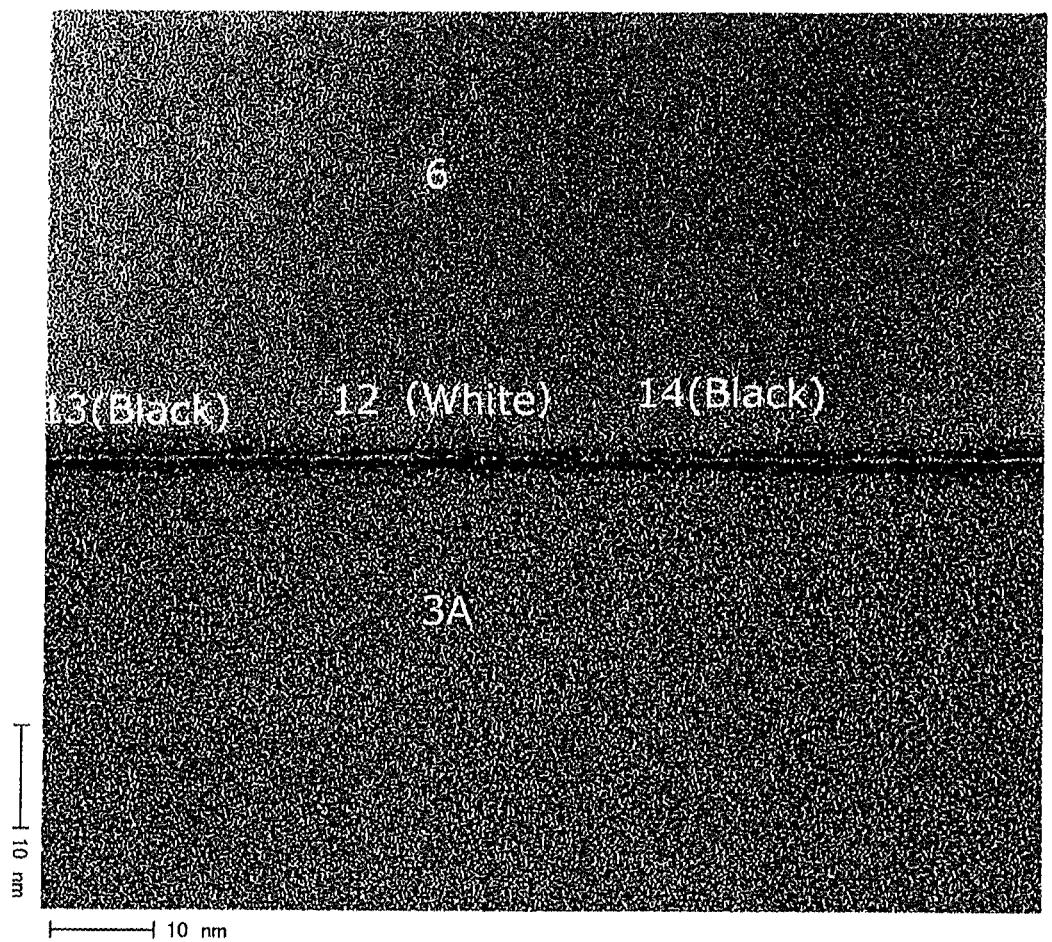
FIG. 2 is a photograph showing essential parts of a bonded body according to an embodiment of the present invention.

FIG. 2 shows essential parts of a bonded body according to an embodiment of the present invention.

The present example corresponds to the embodiment shown in FIG. 1(c). That is, the bonding layer 3A is present on a lower side and the piezoelectric monocrystalline substrate 6 is present on an upper side. Then, it is provided a bonding layer-side intermediate layer 13, interface layer 12 and substrate-side intermediate layer 14 are provided in the order from the bonding layer 3A (lower side) to the piezoelectric monocrystalline substrate 6 (upper side).

Here, according to a preferred embodiment, for example as shown in FIG. 2, the intermediate layer 12 is brighter and the bonding layer-side intermediate layer 13 and substrate-side intermediate layer 14 are darker. However, this photograph is a bright-field image taken by a transmission type electron microscope under the following conditions.

Measuring system:
The microstructure is observed using a transmission type electron microscope (supplied by JEOL Ltd., "JEM-ARM200F").

Measurement conditions:
A sample is thinned by FIB (Focused Ion Beam) method and observed at an acceleration voltage of 200 kV.

Here, the total ratios x, y and z of tantalum and niobium of $E_xO_{(1-x)}$, $G_yO_{(1-y)}$, and $J_zO_{(1-z)}$ are determined as follows.

Measuring system:
Elemental analysis system (supplied by JEOL Ltd., "JED-2300T").

Measurement conditions:
A sample is thinned by FIB (Focused Ion Beam) method and observed at an acceleration voltage of 200 kV.

Processing of measured values:
Amounts of oxygen and tantalum (niobium) are measured at the respective parts of the piezoelectric monocrystalline substrate, substrate-side intermediate layer, interface layer and bonding layer-side intermediate layer. Here, the ratio of the amount of oxygen and total amount of tantalum and niobium of the piezoelectric monocrystalline substrate are standardized as 3:1 in conformity with the chemical formula of $LiAO_3$. That is, a correlation coefficient a is multiplied onto the total amount A of niobium and tantalum of the piezoelectric monocrystalline substrate so that the ratio of A is adjusted at 0.25 (25 atom %). Then, the correlation coefficient α is multiplied onto the measured amounts of A of the substrate-side intermediate layer, interface layer and bonding layer-side intermediate layer, respectively, to calculate x, y and z, respectively.

Preferred production examples of the bonded body of the present invention will be described below.

FIGS. 3 to 5 are diagrams schematically illustrating a production example of providing a bonding layer on a supporting substrate and the bonding layer is bonded to a surface of a piezoelectric monocrystalline substrate by direct bonding.

Figure 3A:
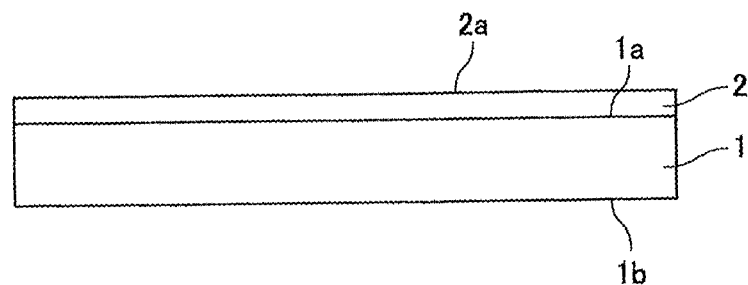
FIG. 3(a) shows the state that a bonded body 2 is provided on a supporting substrate 1.
Figure 3B:
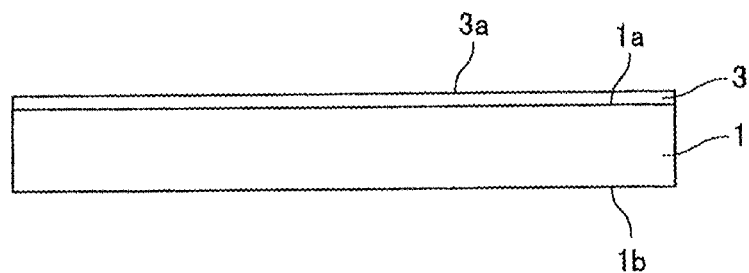
FIG. 3(b) shows the state that a surface 3a of a bonding layer 3 is subjected to flattening process.

As shown in FIG. 3(a), a bonding layer 2 is provided on a surface 1a of a supporting substrate 1. At this time, unevenness may be present on the surface 2a of the bonding layer 2. The surface 2a of the bonding layer 2 is then subjected to flattening process to form a flat surface 3a. By this flattening process, the thickness of the bonding layer 2 is normally made smaller to provide a thinner bonding layer (refer to FIG. 3(b)).

Figure 3C:
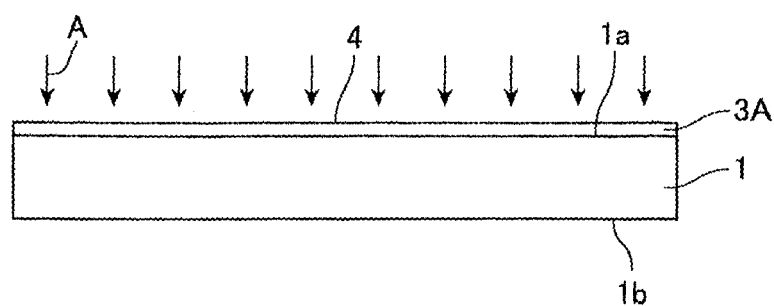
FIG. 3(c) shows the state that a flat surface 4 is activated by neutralized beam A.

Then, as shown in FIG. 3(c), neutralized beam is irradiated onto the flat surface 3a as shown in arrows A to activate the surface of the bonding layer 3A to provide an activated surface 4.

Figure 4A:
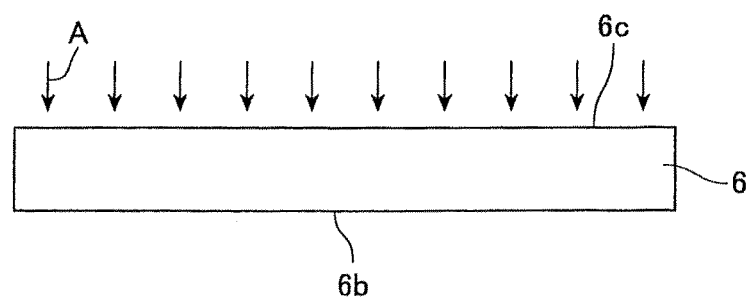
FIG. 4(a) shows the state that a surface 6c of a piezoelectric monocrystalline substrate 6 is activated by neutralized beam A.
Figure 4B:
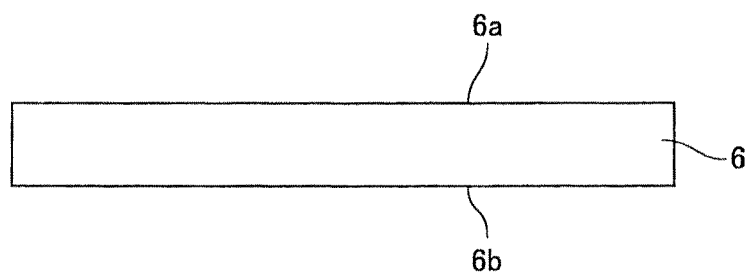
FIG. 4(b) shows the state that the surface 6a of the piezoelectric monocrystalline substrate 6 is activated.
Figure 5A:
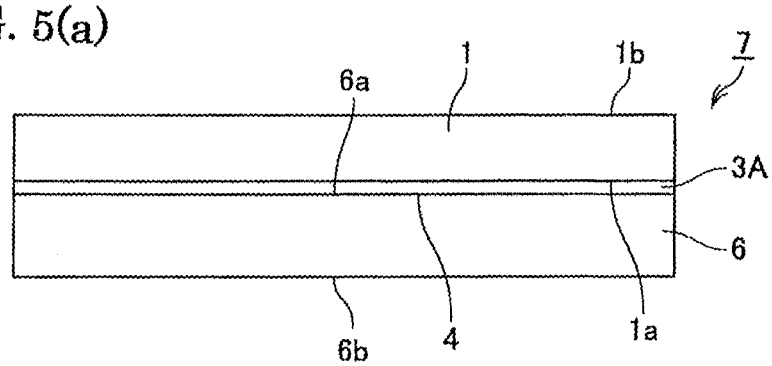
FIG. 5(a) shows the state that the piezoelectric monocrystalline substrate 6 and supporting substrate 1 are bonded.

Further, as shown in FIG. 4(a), neutralized beam A is irradiated onto the surface 6c of the piezoelectric monocrystalline substrate 6 to activate it to provide a piezoelectric monocrystalline substrate 6 having the activated surface 6a (FIG. 4(b)). Then, as shown in FIG. 5(a), the activated surface 6a of the piezoelectric monocrystalline substrate 6 and the activated surface 4 of the bonding layer 3A are bonded by direct bonding, to obtain a bonded body 7.

Figure 5B:
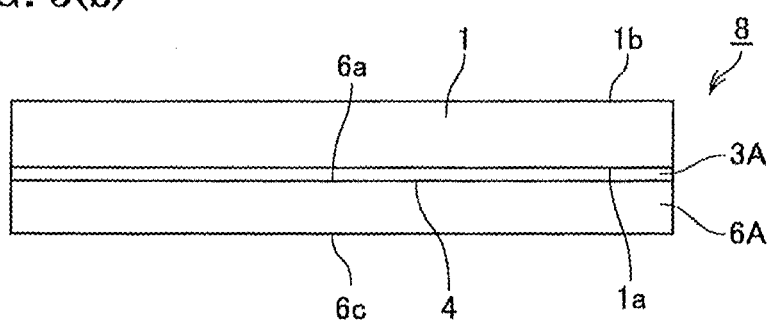
FIG. 5(b) shows the state that a piezoelectric monocrystalline substrate 6A is thinned by processing.

According to a preferred embodiment, the surface 6b of the piezoelectric monocrystalline substrate of the bonded body 7 is further subjected to polishing process to made the thickness of the piezoelectric monocrystalline substrate 6A smaller as shown in FIG. 5(b) to obtain a bonded body 8. 6c represent a polished surface.

Figure 5C:
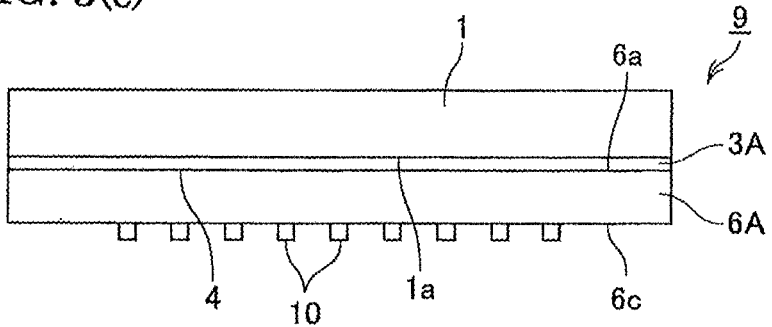
FIG. 5(c) shows the state that electrodes 10 are provided on the piezoelectric monocrystalline substrate 6A.

In FIG. 5(c), electrodes 10 are formed on the polished surface 6c of the piezoelectric monocrystalline substrate 6A to produce a surface acoustic wave device 9.

It will be further described the respective constituents of the present invention below.

Applications of the bonded body of the present invention is not particularly limited, and the bonded body may be appropriately applied to an acoustic wave device and optical device, for example.

As an acoustic weave device, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave, on the surface of the piezoelectric monocrystalline substrate. By applying high frequency signal on the IDT electrode on the input side, electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric monocrystalline substrate. After the lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surfaces of the piezoelectric monocrystalline surface and that the metal film on the piezoelectric monocrystalline substrate is exposed through a cavity provided in the supporting substrate. The material of such metal film includes aluminum, an aluminum alloy, copper, gold or the like, for example. Further, in the case that the Lamb wave device is produced, it may be used a composite substrate having the piezoelectric monocrystalline substrate without the metal film on the bottom surface.

Further, a metal film and an insulating film may be provided on the bottom surface of the piezoelectric monocrystalline substrate. The metal film plays a role of electrodes in the case that the thin film resonator is produced as the acoustic wave device. In this case, the thin film resonator has the structure that electrodes are formed on the upper and bottom surfaces of the piezoelectric monocrystalline substrate and the insulating film is made a cavity to expose the metal film on the piezoelectric monocrystalline substrate. The material of such metal film includes molybdenum, ruthenium, tungsten, chromium, aluminum or the like, for example. Further, the material of the insulating film includes silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric monocrystalline substrate.

According to a preferred production example, neutralized beam may be used to activate the surface of the piezoelectric monocrystalline substrate. Particularly in the case that the surface of the piezoelectric monocrystalline substrate is a flat surface, the surface may be directly bonded to the bonding layer.

In the case that the object of the present invention is a surface acoustic wave device and the material of the piezoelectric monocrystalline substrate is lithium tantalate, it may preferably be used the substrate in which it is rotated in an angle of 36 to 47° (for example 42°) from Y-axis toward Z-axis with respect to X-axis, the direction of propagation of surface acoustic wave, thanks to the low propagation loss.

Further, in the case that the piezoelectric monocrystalline substrate is composed of lithium niobate, it may preferably be used the substrate in which it is rotated in an angle of 60 to 68° (for example 64°) from Y-axis toward Z-axis with respect to X-axis, the direction of propagation of surface acoustic wave, thanks to the low propagation loss. Further, although the size of the piezoelectric monocrystalline substrate is not particularly limited, the diameter is 50 to 150 mm and the thickness is 0.2 to 60 μm, for example.

The material of the supporting substrate is made a single crystal or a ceramic material. It may preferably be listed a material selected from the group consisting of silicon, sapphire, mullite, cordierite, translucent alumina, SiAlON, AlN and $Si_3N_4$.

In the case that the bonding layer is formed on the supporting substrate, although the method of film-forming the bonding layer is not particularly limited, it may be listed sputtering method, chemical vapor deposition (CVD) method and vapor deposition method. On the viewpoint of efficiently film-forming an oxide of at least one element selected from the group consisting of niobium and tantalum, sputtering or vapor deposition method is preferred.

Sputtering method includes reaction sputtering of forming an oxide thin film in atmosphere containing oxygen using a metal target of at least one element selected from the group consisting of niobium and tantalum, and the method of film-forming using a target of an oxide of at least one element selected from the group consisting of niobium and tantalum.

Then, preferably, the surface of the bonding layer is flattened to obtain a flat surface. Here, the method of flattening the surface of the bonding layer includes lapping, chemical mechanical polishing (CMP), and the like. Further, the flat surface may preferably have Ra of 1 nm or lower and more preferably have Ra of 0.3 nm or lower.

Further, the surface of the piezoelectric monocrystalline substrate is flattened to obtain a flat surface. Here, the method of flattening the surface of the piezoelectric monocrystalline substrate includes lapping, chemical mechanical polishing (CMP), and the like. Further, the flat surface may preferably have Ra of 1 nm or lower and more preferably have Ra of 0.3 nm or lower.

Then, according to a preferred embodiment, neutralized beam is irradiated onto the flat surface of the bonding layer to activate the flat surface. Further, neutralized beam is irradiated onto the surface of the piezoelectric monocrystalline substrate to activate the flat surface.

In the case that neutralized beam is used to perform the surface activation, it is preferred to use a system described in patent document 4 to generate the neutralized beam, which is then irradiated. That is, it is used a source of high-speed atomic beam of saddle field type as a beam source. Inert gas is then introduced into a chamber and a high voltage is applied onto electrodes from a direct current electric source. It is thus generated electric field of saddle-field type between the electrode (positive electrode) and a housing (negative electrode), so that electrons e is moved to generate beams of atoms and ions from the inert gas. Among the beams reaching a grid, the beam of the ions is neutralized at the grid so that the beam of the neutral atoms is emitted from the high-speed atomic beam source. Atomic spices forming the beam may preferably be that from an inert gas (argon, nitrogen or the like).

A voltage and current at the time of irradiation of the beam may preferably be made 0.5 to 2.0 kV and 50 to 200 mA, respectively.

Then, the activated surfaces are contacted and bonded with each other under vacuum atmosphere. This process is performed under ambient temperature, which is preferably 40° C. or lower and more preferably 30° C. or lower. The temperature during the bonding step may preferably be 20° C. or higher and more preferably be 25° C. or lower. The pressure during the bonding step may preferably be 100 to 20000N.

EXAMPLES

Inventive Example 1

The bonded body shown in FIGS. 1(c) and 2 was obtained, according to the method described referring to FIGS. 3 to 5.

Specifically, it was prepared the piezoelectric monocrystalline substrate 6 of lithium tantalate (LT) having an orientation flat (OF) part, a diameter of 4 inches and thickness of 250 μm. As the substrate 6, it was used 46° Y-cut X-propagation LT substrate, in which the direction of propagation of the surface acoustic wave (SAW) is X and the Y-cut plate is rotated in a cutting angle. The surface 6c of the piezoelectric monocrystalline substrate 6 was mirror-polished to an arithmetic average roughness Ra of 1 nm.

Further, as the supporting substrate 1, it was prepared a mullite body having an OF part, a diameter of 4 inches, a thickness of 230 μm. The surfaces 1a of the supporting substrate 1 of mullite had an arithmetic average roughness Ra of 2 nm. The arithmetic average roughness was evaluated by means of an atomic force microscope (AFM) in a square visual field of a length of 10 μm and a width of 10 μm.

The supporting substrate 1 was then washed by a scrub washer. Mixed solution of acetone and IPA was used as washing liquid. It was then film-formed the bonding layer 2 of tantalum pentoxide in 0.2 μm on the surface 1a of the supporting substrate 1, using a magnetron and parallel plate type sputtering film-forming system. The film was formed using a target of tantalum pentoxide, under mixed atmosphere of argon and oxygen at a total pressure of 0.5 Pa. Ra after the film formation was 2.0 nm. The bonding layer 2 was then subjected to chemical mechanical polishing (CMP) to a film thickness of 0.15 μm and Ra of 0.3 nm.

The flat surface 3a of the bonding layer 3 and the surface 6a of the piezoelectric monocrystalline substrate 6 were washed to remove dirt thereon, followed by incorporation into a vacuum chamber. It was drawn to vacuum of an order of $10^{-6}$ Pa, and high-speed atomic beam (at an acceleration voltage of 1 kV and a flow rate of Ar of 27 sccm) was irradiated onto each of the bonding surfaces of the substrates over 120 sec. The surface with the beam irradiated (activated surface) of the bonding layer 3A and the activated surface 6a of the piezoelectric monocrystalline substrate 6 were then contacted with each other, followed by pressurizing at 10000 N over 2 minutes to bond the substrates (FIG. 5(a)).

The surface 6b of the piezoelectric monocrystalline substrate 6 was then subjected to grinding and polishing until the thickness was changed from the initial 250 μm to 20 μm. It was not confirmed the separation of the bonded part during the grinding and polishing steps. Further, the bonding strength was evaluated by crack opening method and proved to be 1.8 J/m².

The cross section of the bonded composite substrate was cut out from FIB, and the cross section was observed by TEM (supplied by JEOL Ltd., "JEM-ARM200F") to confirm the microstructure and composition. The photograph of the cross section was shown in FIG. 2. Further, the ratios (atom %) of the elements O and Ta in the respective parts were shown in table 1.

Inventive Examples 2 to 5

It was produced the bonded bodies according to the same procedure as the Inventive Example 1. However, the acceleration voltage of the high-speed electron beam irradiated onto the bonding surface of the substrate were changed to values described in table 1.

The ratios of the elements of the respective parts and bonding strengths measured by crack opening method of the thus obtained bonded bodies were shown in table 1.

Comparative Example 1

The bonded body was produced according to the same procedure as the Inventive Example 1, except that the acceleration voltage of the high-speed electron beam irradiated onto the bonding surfaces of the substrates were changed as described in table 1.

In the thus obtained bonded body, the inventive interface layer was not observed between the bonding layer and piezoelectric monocrystalline substrate. The bonding strength of the bonded body measured by crack opening method was shown in table 1.

TABLE 1

| | | Unit of numerical values (mol %) | | | | | |
|---|---|---|---|---|---|---|---|
| Measurement points | Elements | Inventive Ex. 1 | Inventive Ex. 2 | Inventive Ex. 3 | Inventive Ex. 4 | Inventive Ex. 5 | Com. Ex. 1 |
| Acceleration Voltage (kV) | | 1.0 | 0.8 | 0.9 | 1.4 | 1.8 | 2.0 |
| Piezoelectric monocrystalline substrate 6 | [O] | 75 | 75 | 75 | 75 | 75 | 75 |
| | [Ta] | 25 | 25 | 25 | 25 | 25 | 25 |
| Substrate-side intermediate layer 14 | [O] | 59 | 70 | 64 | 34 | 9 | 7 |
| | [Ta] | 40 | 30 | 36 | 66 | 91 | 93 |
| Interface layer 12 | [O] | 61 | 71 | 66 | 36 | 11 | 9 |
| | [Ta] | 39 | 29 | 34 | 64 | 89 | 91 |
| Bonding-layer side Intermediate layer 13 | [O] | 55 | 65 | 60 | 30 | 5 | 3 |
| | [Ta] | 45 | 35 | 40 | 70 | 95 | 97 |
| Bonding strength (J/m$^2$) | | 1.8 | 1.5 | 1.7 | 1.7 | 1.5 | 0.30 |

The invention claimed is:

1. A bonded body comprising a supporting substrate, a piezoelectric monocrystalline substrate and a bonding layer provided between said supporting substrate and said piezoelectric monocrystalline substrate,
  wherein said piezoelectric monocrystalline substrate comprises a material represented by LiAO$_3$ (A represents at least one element selected from the group consisting of niobium and tantalum),
  wherein said bonding layer comprises a material comprising an oxide of at least one element selected from the group consisting of niobium and tantalum,
  wherein said bonded body further comprises an interface layer along an interface between said piezoelectric monocrystalline substrate and said bonding layer, said interface layer having a composition of E$_x$O$_{(1-x)}$ (E represents at least one element selected from the group consisting of niobium and tantalum and 0.29≤x≤0.89), and
  wherein said bonded body further comprises a substrate-side intermediate layer between said interface layer and said piezoelectric monocrystalline substrate, said substrate-side intermediate layer having a composition of G$_y$O$_{(1-y)}$ (G represents at least one element selected from the group consisting of niobium and tantalum and x<y≤0.91).

2. The bonded body of claim 1, wherein said material of said bonding layer is represented by D$_2$O$_5$, and wherein D represents at least one element selected from the group consisting of niobium and tantalum.

3. The bonded body of claim 1, further comprising a bonding layer-side intermediate layer between said interface layer and said bonding layer, wherein said bonding layer-side intermediate layer has a composition of J$_z$O$_{(1-z)}$ (J represents at least one element selected from the group consisting of niobium and tantalum and x<z≤0.95).

4. The bonded body of claim 1,
  wherein said material of said piezoelectric monocrystalline substrate is represented by LiTaO$_3$,
  wherein said material of said bonding layer is represented by Ta$_2$O$_5$, and
  wherein said interface layer has said composition of Ta$_x$O$_{(1-x)}$.

5. The bonded body of claim 1,
  wherein said material of said piezoelectric monocrystalline substrate is represented by LiTaO$_3$,
  wherein said material of said bonding layer is represented by Ta$_2$O$_5$, and
  wherein said interface layer has said composition of Ta$_x$O$_{(1-x)}$.

6. A bonded body comprising a supporting substrate, a piezoelectric monocrystalline substrate and a bonding layer provided between said supporting substrate and said piezoelectric monocrystalline substrate,
  wherein said piezoelectric monocrystalline substrate comprises a material represented by LiAO$_3$ (A represents at least one element selected from the group consisting of niobium and tantalum),
  wherein said bonding layer comprises a material comprising an oxide of at least one element selected from the group consisting of niobium and tantalum,
  wherein said bonded body further comprises an interface layer along an interface between said piezoelectric monocrystalline substrate and said bonding layer, said interface layer having a composition of E$_x$O$_{(1-x)}$ (E represents at least one element selected from the group consisting of niobium and tantalum and 0.29≤x≤0.89), and
  wherein said bonded body further comprises a bonding layer-side intermediate layer between said interface layer and said bonding layer, said bonding layer-side intermediate layer having a composition of J$_z$O$_{(1-z)}$ (J represents at least one element selected from the group consisting of niobium and tantalum and x<z≤0.95).

7. The bonded body of claim 6, wherein said material of said bonding layer is represented by D$_2$O$_5$, and wherein D represents at least one element selected from the group consisting of niobium and tantalum.

* * * * *